United States Patent [19]
Hashimoto

[11] Patent Number: 6,066,512
[45] Date of Patent: May 23, 2000

[54] SEMICONDUCTOR DEVICE, METHOD OF FABRICATING THE SAME, AND ELECTRONIC APPARATUS

[75] Inventor: Nobuaki Hashimoto, Suwa, Japan

[73] Assignee: Seiko Epson Corporation, Tokyo, Japan

[21] Appl. No.: 09/227,895

[22] Filed: Jan. 11, 1999

[30] Foreign Application Priority Data

Jan. 12, 1998 [JP] Japan .................... 10-016343

[51] Int. Cl.⁷ .................... H01L 21/44; H01L 21/48; H01L 21/50; H01L 23/12; H01L 23/053
[52] U.S. Cl. .................... 438/112; 438/110; 438/121; 438/122; 257/701
[58] Field of Search .................... 438/110, 113, 438/112, 122; 257/690, 707, 717, 724, 701

[56] References Cited

U.S. PATENT DOCUMENTS

| | | | |
|---|---|---|---|
| 5,023,202 | 6/1991 | Long | 437/206 |
| 5,083,191 | 1/1992 | Ueda | 257/783 |
| 5,442,232 | 8/1995 | Goto | 257/668 |
| 5,518,964 | 5/1996 | DiStefano | 438/113 |
| 5,661,086 | 8/1997 | Nakashima | 257/668 |
| 5,785,535 | 7/1998 | Brodsky | 439/73 |
| 5,804,872 | 9/1998 | Miyano | 257/668 |
| 5,901,041 | 5/1999 | Davies | 361/704 |

FOREIGN PATENT DOCUMENTS

| | | |
|---|---|---|
| 2-12848 | 1/1990 | Japan . |
| 3-215953 | 9/1991 | Japan . |

*Primary Examiner*—Charles Bowers
*Assistant Examiner*—Nema Berezny
*Attorney, Agent, or Firm*—Oliff & Berridge, PLC

[57] ABSTRACT

A method of making semiconductor devices comprising the steps of: preparing non-defective individual film packages having good quality, wherein leads are formed and a semiconductor chip is mounted on each of the film packages; attaching each of the non-defective individual packages to each of mounting portions of a plate; and cutting the plate into separate pieces, each of the separated pieces corresponding to each of the mounting portions on which each of the non-defective individual film packages is mounted.

43 Claims, 7 Drawing Sheets

SEMICONDUCTOR DEVICE, METHOD OF FABRICATING THE SAME, AND ELECTRONIC APPARATUS

BACKGROUND OF THE INVENTION

1. Field of the Invention

The present invention relates to a semiconductor device, a method for fabricating the same, and an electronic apparatus.

2. Description of Related Art

In the microminiaturization of semiconductor devices, a bare chip mounting arrangement is regarded as an ideal form of assembly. However, since quality assurance and the handling of a bare chip are difficult in practice, the chip is assembled in a package during semiconductor device fabrication. As one of the package forms meeting the need for high pin counts, a ball grid array (BGA) type package has been developed recently. On a substrate of the BGA type package, external terminal bumps are arranged in an area array to permit surface mounting.

As one kind of BGA type package, a tape ball grid array (T-BGA) package in which a flexible substrate (film carrier tape) is used as a base in fabrication with a tape automated bonding (TAB) technique has been used. Using the advantageous features of the film carrier tape, a T-BGA packaging technique can provide fine-pitch, high-pin-count semiconductor devices.

Since the film carrier tape is liable to warp due to lack of rigidity, however, attaching a reinforcing sheet (stiffener) is required. In the process of semiconductor device fabrication, a stiffener is attached to an individual piece of film carrier tape punched out after each semiconductor chip is mounted on the film carrier tape. More particularly, the film carrier tape is punched out into separate pieces, the pieces are inspected, and then the stiffener is attached only to the non-defective pieces with good quality. In this manner, production yields can be increased since defective pieces of film are rejected prior to attaining the finished product.

After this process, individual pieces of film must be handled in subsequent steps such as bump formation, resulting in trouble in fabrication.

It is therefore an object of the present invention to obviate the above-mentioned drawback by providing a method of fabrication T-BGA packages which are suitable for mass-production and easy to handle, a semiconductor device fabricated by this method, and an electronic apparatus containing the semiconductor device thus fabricated.

SUMMARY OF THE INVENTION (1) According to a first aspect of the present invention, there is provided a method of making semiconductor devices, comprising the steps of:

preparing non-defective individual film packages having good quality, wherein each of the non-defective individual film packages has a flexible substrate on which a wiring pattern is formed and a semiconductor chip having electrodes that are connected to the wiring pattern;

attaching each of the non-defective individual film packages to each of mounting regions of a reinforcing member; and cutting the reinforcing member into separate pieces, each of the separated pieces corresponding to each of the mounting regions on which each of the non-defective individual film packages is mounted.

In this method, the reinforcing member represents any part serving to prevent a film carrier type from warping or bowing (to ensure planarity). As a reinforcing member, a so-called stiffener is often used in the semiconductor device fabrication.

A plurality of mounting regions are provided on the reinforcing member and an individual film package is attached to each of them. Since a plurality of individual film packages forming a plurality of semiconductor devices are integrated with the reinforcing member, the subsequent steps can be carried out on a mass-production line.

Further, where each individual film package is accurately attached to each mounting region of the reinforcing member, a relative positional relation between the reinforcing member and the individual film packages is fixed, thus improving the positional accuracy.

Furthermore, the semiconductor chips are mounted on only non-defective individual film packages having good quality. Therefore, in the subsequent steps after the non-defective individual film packages with good quality are selected (more specifically in the subsequent steps after the non-defective individual film packages are attached to the reinforcing member), production yields can be increased substantially.

(2) The method of making semiconductor devices of the present invention may further comprise, before the non-defective individual film packages are prepared, the steps of:

mounting the semiconductor chip on each of predetermined areas in a film carrier tape having the wiring pattern formed on each of the predetermined areas, punching out the film carrier tape into individual film packages, and selecting the non-defective individual film packages having good quality from the individual film packages through inspection.

Since the TAB process is applied to this method, an existing TAB process production line may be used and the advantageous features of the TAB process can be utilized.

The method of making semiconductor devices may further comprise a step of molding a region including a connecting portion between the semiconductor chip and the film carrier tape with a resin.

(3) In the method of making semiconductor devices of the present invention, after each of the non-defective individual film packages is attached to each of the mounting regions of the reinforcing member, the subsequent steps may be carried out on a production line for plastic ball grid assay (P-BGA) type packages.

On the P-BGA package production line, such processes as marking, ball (bump) formation, cleaning, separation into product pieces and appearance inspection can be carried out.

The P-BGA package is fabricated on the base of a printed circuit board. A plurality of semiconductor chips are mounted on the printed circuit board, and then the printed circuit board is punched out into separate product pieces, each of which corresponds to each semiconductor chip.

The method of the present invention can utilize the P-BGA package production line by using the reinforcing member having a plurality of individual film packages attached thereon in lieu of the printed circuit board. Thus, when an existing production line for P-BGA packages is available, no investment in new facilities is required thereby reducing manufacturing cost.

(4) The method of making semiconductor devices of the present invention may further comprise the step of forming external electrodes on the wiring pattern, after the step of attaching each of the non-defective individual film packages to each of the mounting regions of the reinforcing member, and before the step of cutting the reinforcing member.

Before the reinforcing member is cut into pieces, the plurality of non-defective individual film packages are attached thereon. Since external electrodes are formed in this time, the external electrodes can be formed on the plurality of non-defective individual film packages simultaneously or in succession, thus reducing fabrication time.

(5) In the method of making semiconductor devices of the present invention, a slot may be formed along a cutting line for the reinforcing member so as to enclose each of the mounting regions that is supported only by at least one supporting portion; and the step of cutting the reinforcing member may be carried out by cutting the supporting portion.

Since only the supporting portion is cut, a reinforcing member made of a rigid material could be easily cut. Further, deformation of the mounting region of the reinforcing member can be prevented to ensure planarity of the individual film packages attached thereon.

(6) The method of making semiconductor devices of the present invention may further comprise, after the step of attaching each of the non-defective individual film packages to each of the mounting regions of the reinforcing member, and before the step of cutting the reinforcing member, the step of attaching a heat spreading member to a region including the semiconductor chip.

The heat spreading member is used to efficiently dissipate heat from the semiconductor chip and it is attached to the semiconductor chip as required depending on the amount of heat to be produced. Before the reinforcing member is cut into separate pieces, a plurality of semiconductor chips are attached thereon. It is therefore possible to attach a plurality of heat spreading members to the semiconductor chips simultaneously.

(7) In the method of making semiconductor devices of the present invention, an edge portion of the heat spreading member may be disposed inside the cutting line for the reinforcing member; and in the step of cutting the reinforcing member, both sides of the reinforcing member may be clamped by a pair of holding members at the position that is outside the heat spreading member and inside the cutting line for the reinforcing member, enabling the shear force to be applied to the reinforcing member to be cut at the position that is outside the holding members.

Since the vicinity of the cutting line for the reinforcing member shield by the holding members, the reinforcing member can be prevented from being distorted at the cutting. Therefore, the planarity of the individual film packages can be ensured, resulting in satisfactory mounting of external electrodes.

(8) In the method of making semiconductor devices of the present invention, when a slot is formed along a cutting line for the reinforcing member so as to enclose each of the mounting regions that is supported only by at least one supporting portion, an outline of the heat spreading member may be approximately aligned with an edge of the slot on the side of each of the mounting regions, the heat spreading member being disposed inside a connecting portion in each of the mounting regions connecting with the supporting portion; and in the step of cutting the reinforcing member, both sides of the reinforcing member may be clamped by a pair of holding members at the position that is outside the heat spreading member and inside a cutting line for the supporting portion, enabling the shear force to be applied to the supporting portion at the position that is outside the holding members.

Since the vicinity of the cutting line for the supporting portion of the reinforcing member is held by the holding members, the reinforcing member can be prevented from being distorted at the cutting.

(9) In the method of making semiconductor devices of the present invention, when a slot is formed along a cutting line for the reinforcing member so as to enclose each of the mounting regions that is supported only by at least one supporting portion, the heat spreading member may be superposed on the reinforcing member and have a planar configuration to cover the slot, each of the mounting regions, and the supporting portion of the reinforcing member; and the heat spreading member may be cut together with the reinforcing member.

A plurality of semiconductor chips are mounted on the reinforcing member. By superposing the heat spreading member having a planar configuration on the reinforcing member, the heat spreading members can be attached to a plurality of semiconductor chips simultaneously. Thus, the time required for aligning and attaching the heat spreading member can be reduced.

(10) In the method of making semiconductor devices of the present invention, the heat spreading member and the reinforcing member may be provided with convex and concave portions to the engaged mutually. The heat spreading member and the reinforcing member can be thus aligned with ease.

(11) According to a second aspect of the present invention, there is provided a semiconductor device fabricated by using the abovementioned method.

(12) According to a third aspect of the present invention, there is provided a circuit board on which is mounted the abovementioned semiconductor device.

(13) According to a fourth aspect of the present invention, there is provided an electronic apparatus including the abovementioned circuit board.

DETAILED DESCRIPTION OF THE PREFERRED EMBODIMENTS

The present invention will now be described in detail by way of example with reference to the accompanying drawings.

Figure 6:
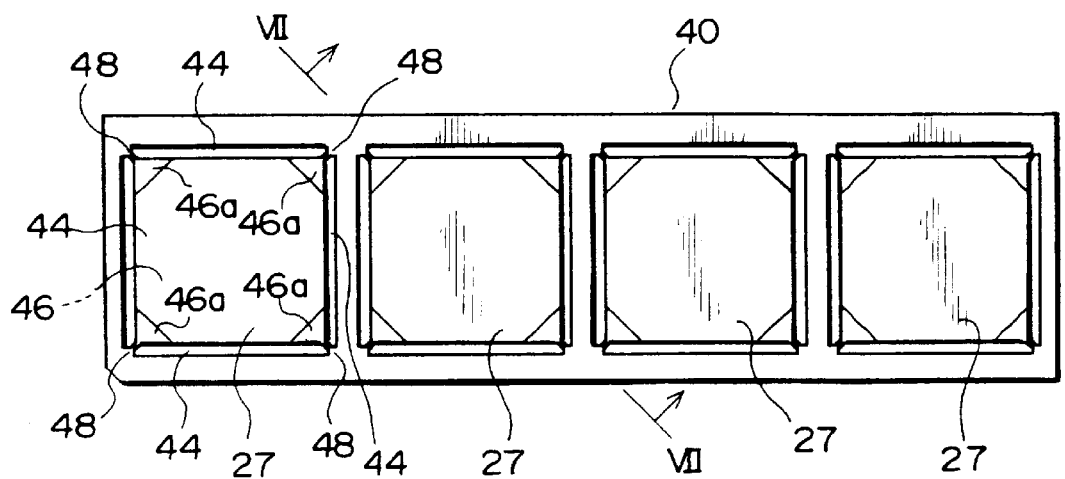
FIG. 6 is a diagram showing the reinforcing member on which a heat spreading member is attached.
Figure 7:
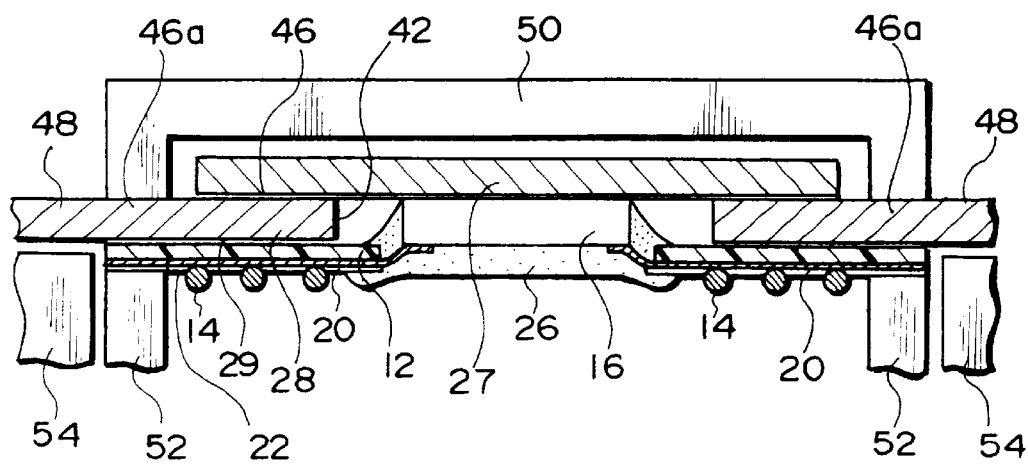
FIG. 7 is a diagram showing a step of cutting the reinforcing member.
Figure 8:
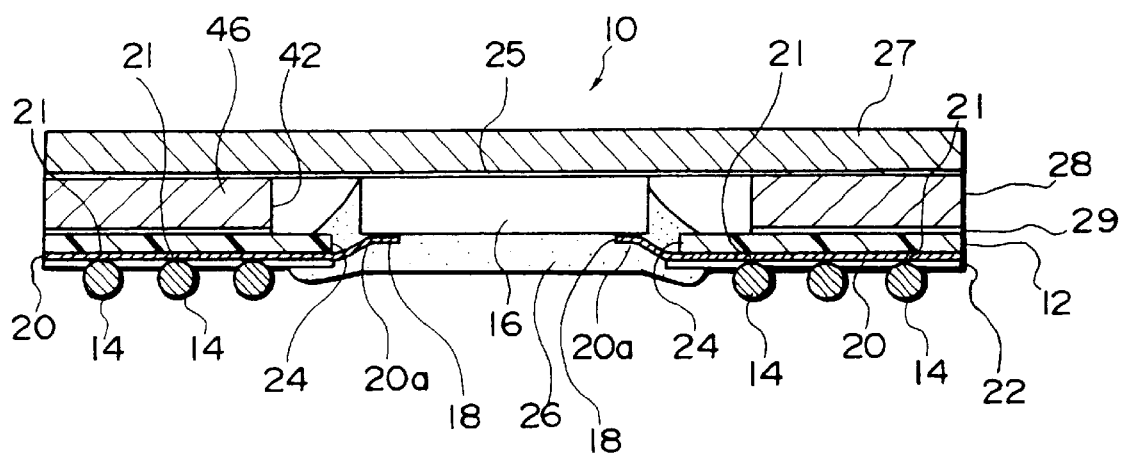
FIG. 8 is a diagram showing the embodiment of a semiconductor device according to the present invention.

FIGS. 1A to 7 are explanatory diagrams illustrating semiconductor device fabrication processes in the embodiment of the present invention, and FIG. 8 shows a finished semiconductor device according to the embodiment of the present invention.

As shown in FIG. 8, a BGA package is applied to a semiconductor device 10. In this figure, the semiconductor device 10 comprises an insulating film 12, a plurality of leads 20 formed on the insulating film 12, a bumps 14 formed on each of the leads 20, and a semiconductor chip 16. Surface mounting can be implemented by using the plurality of the bumps 14. The bump 14 is used as an external electrode.

Figure 1A:
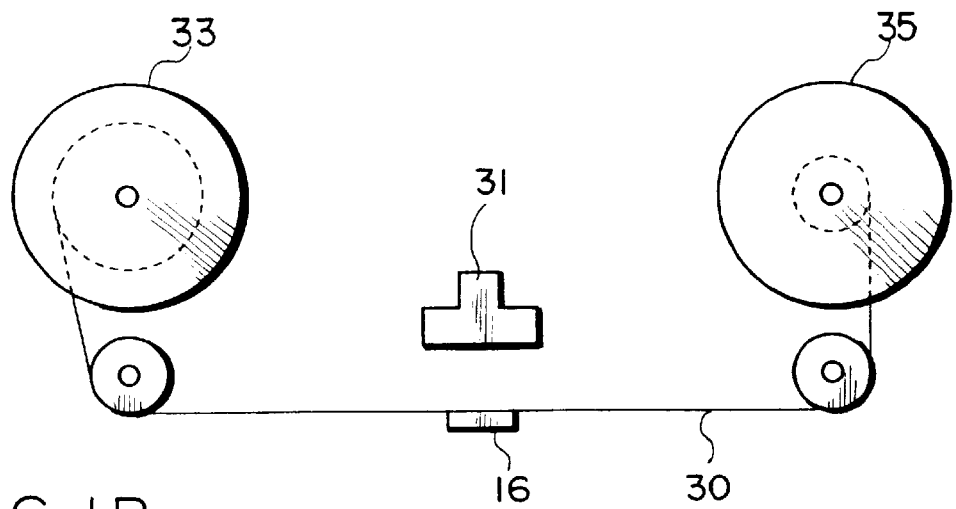
FIGS. 1A to 1C are explanatory diagrams illustrating the semiconductor device fabrication processes according to the embodiment of the present invention.
Figure 1B:
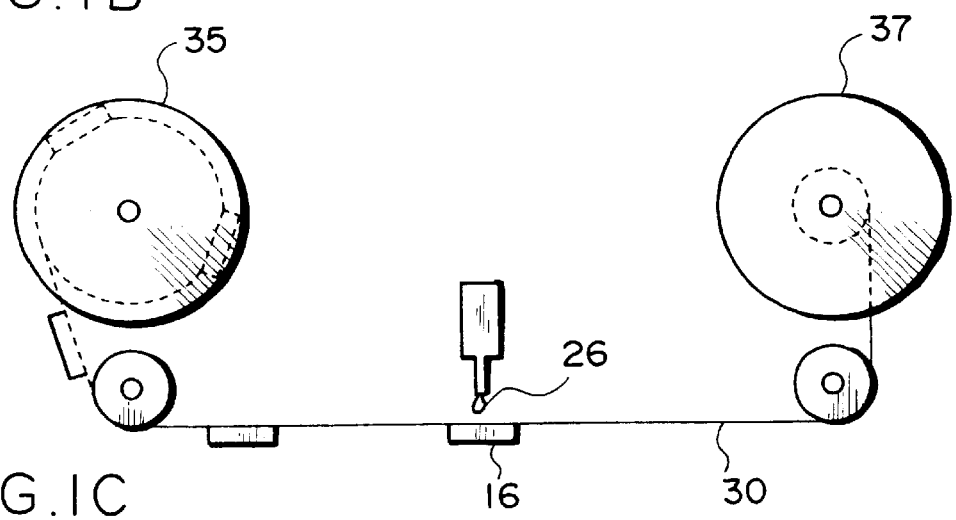
Figure 1C:
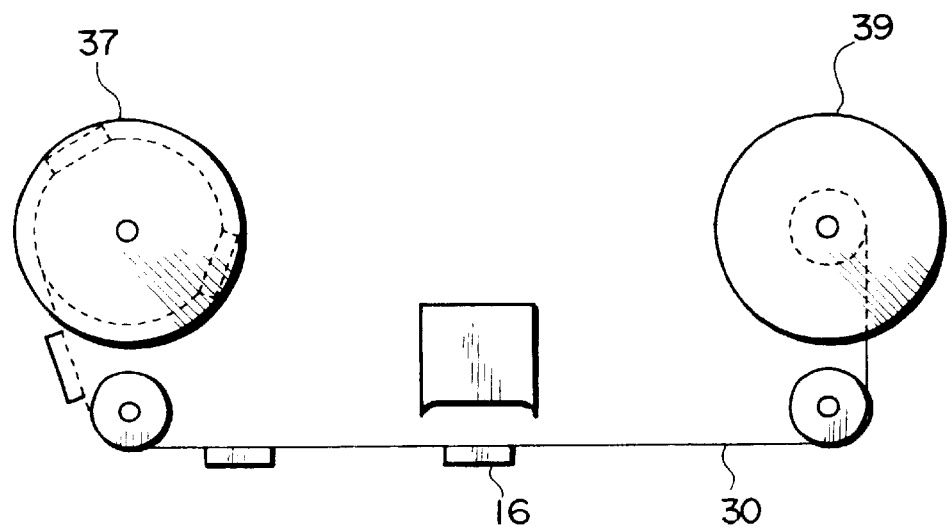
Figure 2:
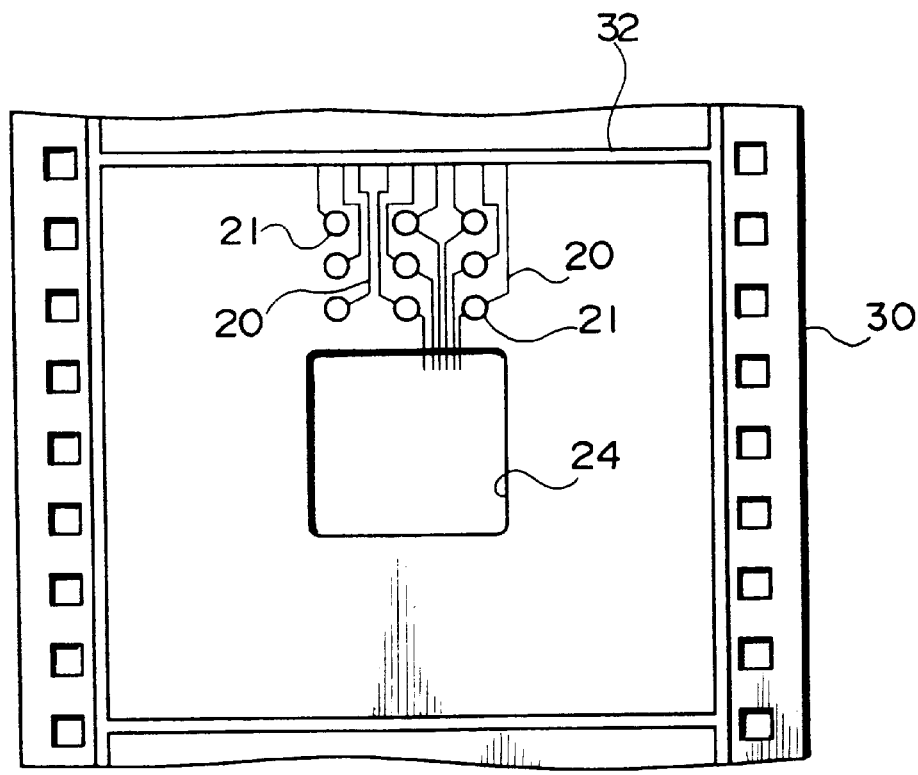
FIG. 2 is a diagram showing a film carrier tape in the embodiment of the present invention.

The insulating film 12 is obtained by punching out a long film carrier tape 30 shown in FIGS. 1A to 2, and the insulating film 12 is formed to be larger than the semiconductor chip 16. A device hole 24 is formed on the insulating film 12.

An end 20a of the lead 20 protrudes into the device hole 24, and the end 20a is connected to an electrode 18 of the semiconductor chip 16. More particularly, the semiconductor chip 16 is disposed so that the electrode 18 thereof is positioned inside the device hole 24 and on the side opposite to the lead-20 forming side of the insulating film 12, whereby the end 20a of the lead 20 is bonded to the electrode 18.

The lead 20 connects the electrode 18 of the semiconductor chip 16 to a land 21 (see FIG. 2). The land 21 is provided with the bump 14. Each bump 14 is made of a material such as solder, for example, and the end thereof has a ball-like shape. Copper or the like may be used in lieu of solder as the material for the bump 14.

Solder resist 22 is applied onto the lead-20 forming side of the insulating film 12, while circumventing the bumps 14. The surface of the lead 20 is thus covered with the solder resist 22 for protection.

A stiffener 28 having a plate-like shape is attached to the insulating film 12 on the side opposite to the bumps 14. The stiffener 28 is made of copper, stainless steel, copper alloy or the like, and is strong enough to maintain a planar configuration. The stiffener 28 is attached to the insulating film 12 by means of an insulating adhesive 29. The insulating adhesive 29 is applied in the form of a thermosetting or thermoplastic film. Circumventing the semiconductor chip 16, the stiffener 28 is attached to the entire surface of the insulating film 12. Thus, the stiffener 28 prevents the insulating film 12 from being distorted or warped. This ensures uniformity in the height of the bumps 14 to improve planarity thereof, leading to an enhancement of yield in the mounting of semiconductor devices on circuit boards.

Further, a heat spreader 27 is bonded to the semiconductor chip 16 on the side opposite to the surface-mounted side via a thermally conductive adhesive 25 such as silver paste. Thus, heat from the semiconductor chip 16 can be efficiently dissipated. The heat spreader 27 is formed to be larger in size than the semiconductor chip 16 and can be bonded to the stiffener 28. Between the stiffener 28 and the heat spreader 27, the thermally conductive adhesive 25 is provided for hermetic bonding. Depending on the amount of heat produced by the semiconductor chip 16, an ordinary insulating adhesive or the insulating film mentioned above may be used in lieu of the thermally conductive adhesive 25.

The interstices between the semiconductor chip 16 and the insulating film 12 are sealed by potting of epoxy resin 26. The epoxy resin 26 is also applied to the device hole 24 and the periphery of semiconductor chip 16.

The embodiment of the semiconductor device of the present invention has a configuration as described above, and the method of fabricating such semiconductor device is now described below.

TAB Process

First, as shown in FIGS. 1A to 1C, the semiconductor chip 16 is mounted on the film carrier tape 30, the potting with epoxy resin 26 is performed, and the film carrier tape 30 is punched out into separate pieces of insulating film 12 in the TAB process.

More particularly, the semiconductor chip 16 is mounted on the film carrier tape 30 as shown in FIG. 1A. An enlarged view of the film carrier tape 30 is shown in FIG. 2.

The film carrier tape 30 is made of a material such as polyimide resin. On the film carrier tape 30, device holes 24 are formed, and a plurality of leads 20 and a plurality of lands 21 are arranged outside it.

More specifically, on the film carrier tape 30, a plurality of device holes 24 are formed, and a plurality of leads 20 and a plurality of lands 21 are provided outside each device hole 24. In this figure, some of the leads 20 and lands 21 are indicated while others are omitted.

The land 21 is connected to a plating lead 32 through a region of the lead 20 extending in a direction away from the device hole 24. All the leads 20, including those not shown in this figure, are connected to the plating lead 32. By using the plating lead 32, all of the leads 20 and lands 21 are electroplate. The leads 20 and lands 21 may be plated by an electroless plating technique. In this case, it is not necessary to provide the plating lead 32.

The film carrier tape 30 mentioned above is wound on a reel 33 as shown in FIG. 1A. The end of the film carrier tape 30 is rolled out, and then rolled up by a take-up reel 35. By using a bonding jig 31, the semiconductor chip 16 is bonded to the film carrier tape 30 between the reels 33 and 35. For this bonding process, either single-point bonding or gang bonding may be employed. With the gang bonding, the ends 20a of all the leads 20 can be bonded to the electrodes 18 of each semiconductor chip 16 simultaneously.

A plurality of semiconductor chips 16 are thus mounted on the film carrier tape 30 successively, and then the reel 35 takes up the film carrier tape 30 having the a plurality of semiconductor chips 16 mounted thereon.

Then, as shown in FIG. 1B, the reel 35 having the film carrier tape 30 wound thereon is set on another fabrication equipment. The film carrier tape 30 is rolled out and placed between the reels 35 and 37, and the epoxy resin 26 is potted to the film carrier tape 30. Note that FIG. 8 shows where the epoxy resin 26 is potted.

Then, after the film carrier tape 30 is taken up by the reel 37, the reel 37 is set on still another fabrication equipment as shown in FIG. 1C. The film carrier tape 30 is rolled out and placed between the reels 37 and 39. The film carrier tape 30 is then punched out into separate pieces of insulating film 12.

Figure 3:
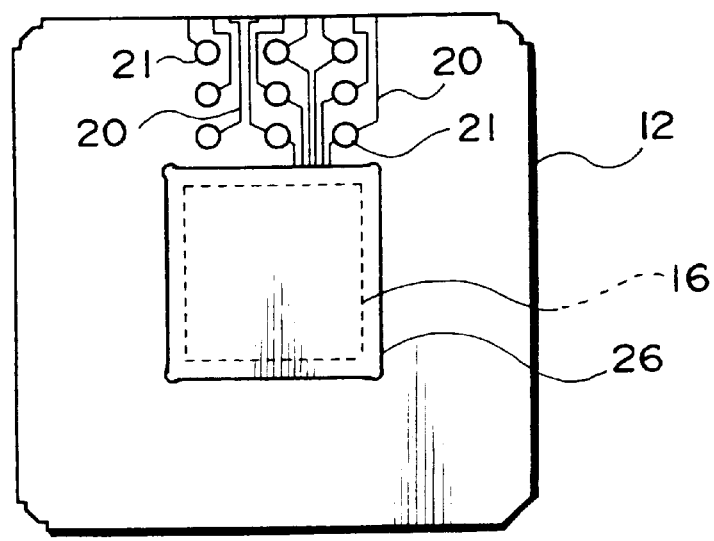
FIG. 3 is a diagram showing the insulating film punched out from the film carrier tape.

FIG. 3 shows a separate piece of insulating film 12. As shown in this Figure, the individual insulating film 12 thus punched out has the semiconductor chip 16 mounted thereon, the semiconductor chip 16 being sealed with the epoxy resin 26.

After the above-mentioned steps, each insulating film 12 is subjected to inspection for selection of non-defective items with good quality only. These inspections include a chip mounting condition check and an electrical characteristic test, for example.

Since the above steps can be carried out in conventional TAB process, existing fabrication equipment may be adapted. While the chip mounting, resin potting and punching-out steps are implemented using different apparatuses for fabrication in the embodiment described above, these fabrication apparatuses may be combined into one production line. Alternatively, any fabrication equipment capable of carrying out these mounting, potting and punching steps in succession may be employed. It is also possible to use any fabrication equipment capable of successively carrying out the punching-out step and the intermediate process described below.

Intermediate Process

Figure 4:
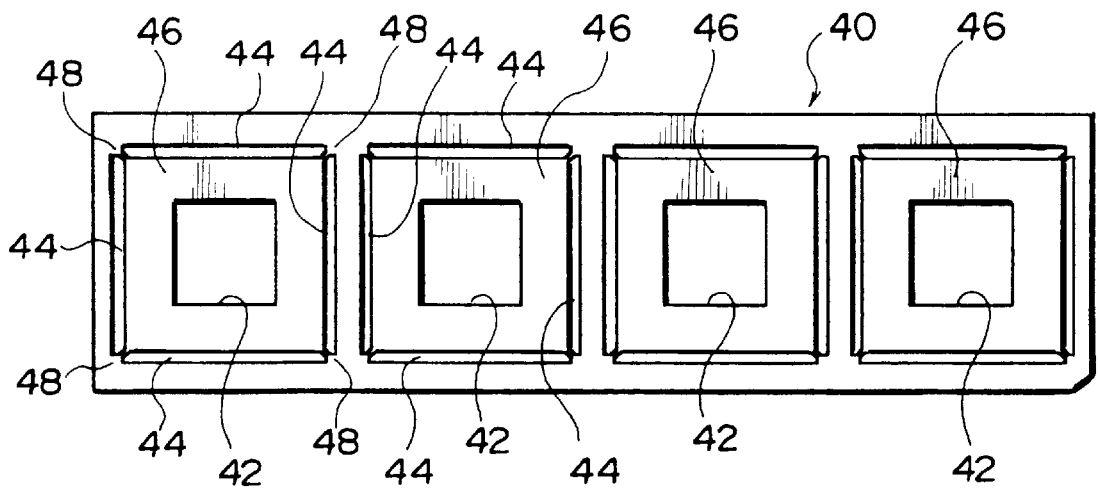
FIG. 4 is a diagram showing a reinforcing member in the embodiment of the present invention.

The plate 40 shown in FIG. 4 is prepared. In a later step, the plate 40 is punched out into separate pieces, i.e., stiffeners 28 (see in FIG. 8).

A plurality of device holes 42 and a plurality of slots 44 are formed on the plate 40. As shown in FIG. 8, the device hole 42 is formed to have a rectangular (square) shape larger then the outline of the semiconductor chip 16 so that the semiconductor chip 16 can be positioned therein without touching the plate.

Each slot 44 is formed on the outside of the four sides of each device hole 42 and in parallel to one of the four sides thereof. Of the parallel long sides of the slot 44, one long side near the device hole 42 becomes one outline side of the stiffener 28. Namely, the slot 44 is formed along a cutting line for punching out the plate 40 into stiffeners 28.

The adjacent slots 44 are not in communication with each other. Therefore, a mounting portion 46 on which the individual insulating film 12 is to be attached as shown in FIG. 8 is enclosed by the slots 44 but sustained by supporting portions 48. Each supporting portion 48 is located on an extended diagonal line of the device hole 42.

The plate 40 configured as mentioned above has a plurality of mounting portions 46 corresponding to a plurality of semiconductor chips 16.

The aforesaid insulating film 12 is then attached to each mounting portion 46 of the plate 40. Only non-defective insulating films 12 with good quality, each having the semiconductor chip 16 mounted thereon, are allowed to be attached. Therefore, production yields can be increased in the subsequent steps.

Figure 5:
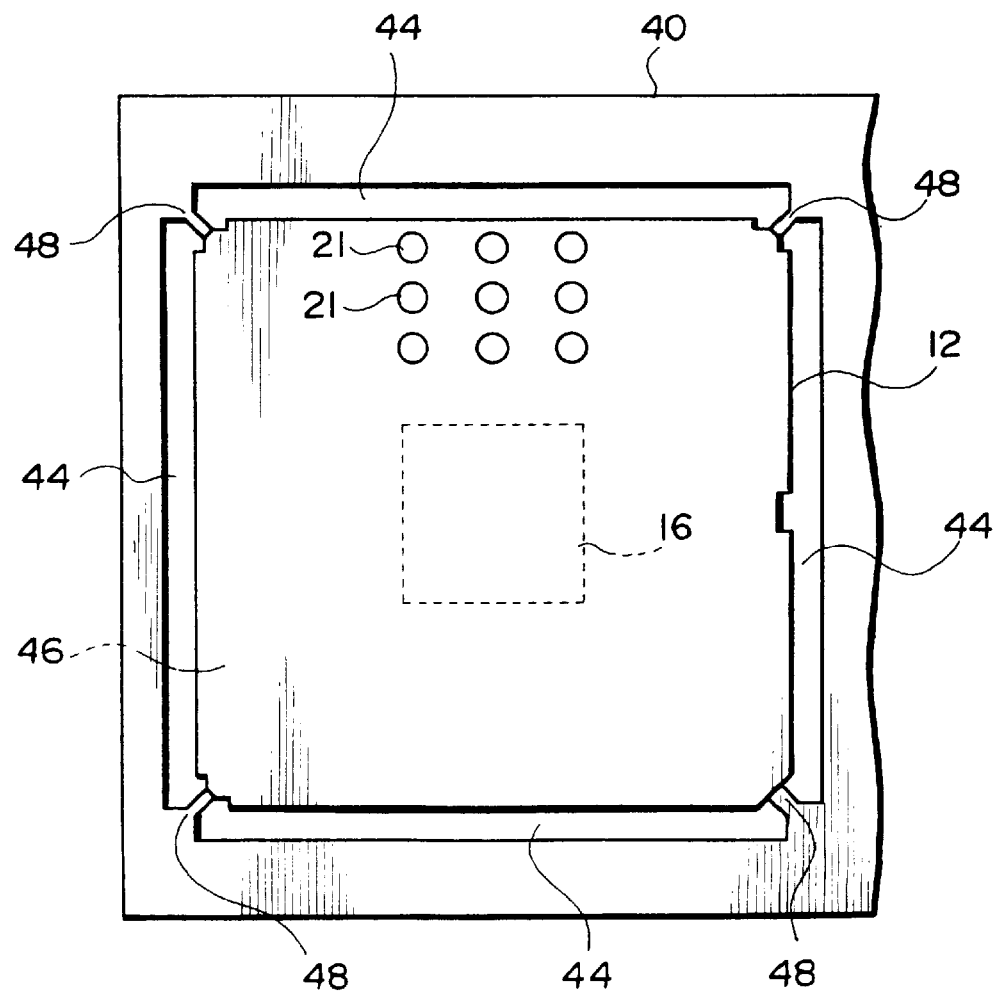
FIG. 5 is a diagram showing the reinforcing member on which the insulating film is attached.

FIG. 5 shows the plate 40 on which the insulating film 12 is attached. In this Figure, the insulating film 12 is attached on the plate 40 with the semiconductor-chip-16-mounting side facing down. The semiconductor chip 16 is positioned inside the device hole 42 of the plate 40. Therefore, the lands 21 and the leads (not shown) are exposed on the side opposite to the plate 40 (front side in the Figure).

The insulating film 12 is bonded to the plate 40 via the insulating adhesive 29 indicated in FIG. 8. The insulating adhesive 29 may be prepared in a thermosetting or thermoplastic film form and previously attached to the plate 40. Thus, the plate 40 can be thermocompression-bonded to the insulating film 12 on the side where the semiconductor chip 16 protrudes.

As shown in FIG. 5, the insulating film 12 slightly extends from the mounting portion 46 into the slot 44, so that positioning for formation of bumps 14 and other processes can be made by using the outline of the insulating film 12 as a guide.

Then, as shown in FIG. 6, the individual heat spreader 27 is attached for each semiconductor chip 16 (not illustrated). More specifically, as shown in FIG. 8, the heat spreader 27 is bonded to cover the semiconductor chip 16 on the side opposite to the electrodes 18 and the mounting portion 46 of the plate 40 (stiffener 28). For this bonding, the thermally conductive adhesive 25 is used. The thermally conductive adhesive 25 may be in paste or tape form. When the thermally conductive adhesive 25 in tape form is used, it may be previously attached to the heat spreader 27. In case that the amount of heat produced by the semiconductor chip 16 is relatively small, an insulating adhesive may be used instead of the thermally conductive adhesive.

As shown in FIG. 6, the heat spreader 27 is configured not to extend into the slot 44 from the long side. Further, the heat spreader 27 is formed to circumvent a connecting portion 46a in the mounting portion 46 of the plate 40 connecting with the supporting portion 48. Namely, the connecting portion 46a is exposed, not covered with the heat spreader 27.

In the description given above, the supporting portion 48 is a part that is positioned outside the cutting line at which each stiffener 28 is separated from the plate 40. The connecting portion 46a is a part that is positioned inside the cutting line for separating the stiffener 28 from the plate 40. Therefore, "cutting the supporting portion 48" and "cutting the connecting portion 46a" designate the same process, that is, separating each stiffener 28 from the plate 40.

Post Process

After completion of the above-mentioned steps, the plate 40 having the insulating film 12 and heat spreader 27 attached thereon is put on a P-BGA package production line in the post process. By arranging the plate 40 having the insulating film 12 attached thereon to have the same configuration as that of a printed board for convention P-BGA packages, this production line can be utilized.

In the post process, any indication such as a product name is marked on the heat spreader 27, bumps 14 are formed on the lands 21 disposed on the insulating film 12, and then the cleaning is carried out. These steps are the same as those in conventional methods.

Then, the plate 40 is cut into separate pieces, i.e., stiffeners 28. FIG. 7 is a cross-sectional view of the plate 40 taken along the line VII—VII in FIG. 6, showing a process in which each stiffener 28 is punched out from the plate 40.

As shown in FIG. 7, the plate 40 is held between a pair of holding jigs 50 and 52. More specifically, the plate 40, insulating adhesive 29, insulating film 12, lead 20 and solder resist 22 are held between the regaining jigs 50 and 52.

With respect to a planar position of the plate 40, the connecting portion 46a in the mounting portion 46 connecting with the supporting portion 48 is held between the holding jigs 50 and 52, and the supporting portion 48 is at the position that is outside the holding jigs 50 and 52. In other words, the plate 40 is held between the holding jigs 50 and 52 at a position which is outside the heat spreader 27 and inside the cutting line. In this state, by using a cutting punch 54, a shear force is applied to the supporting portion 48 to cut it.

In the present embodiment mentioned above, both sides of the plate 40 are held between the holding jigs 50 and 52 at a position inside the cutting line to be disconnected by the cutting punch 54. Therefore, the entire stiffener 28 and the connecting portion 46a thereof are not deformed at the time of shearing by the cutting punch 54. Thus, the insulating film 12 is prevented from being distorted or warped, ensuring uniformity in the height of the bumps 14 to improve planarity thereof. This leads to enhancement of yield in the mounting of semiconductor devices on circuit boards.

Since the above steps can be carried out by using the TAB process and P-BGA package production lines, existing fabrication facilities can be utilized.

Figure 9:
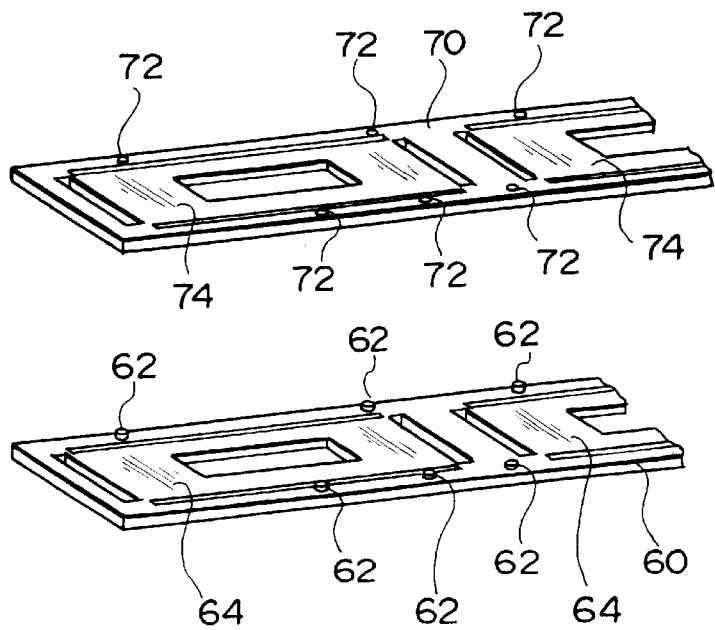
FIG. 9 is a diagram showing a modification of the embodiment of the present invention.

It is to be understood that the present invention is not limited in its application to the above-mentioned embodiments and various changes and modifications may be made therein. For example, the aforesaid heat spreader 27 may have the same configuration as that of the plate 40. Thus, both the plate 40 and the heat spreader 27 superposed thereon can be cut off at the same time. FIG. 9 shows a modified embodiment in connection with the heat spreader and plate.

In FIG. 9, a plate 60 has the same configuration as that of the aforesaid plate 40 except that convex portions 62 are formed on one side thereof, and a plurality of mounting portions 64 are provided on the plate 60. A heat spreader 70 also has the same configuration as that of the aforesaid plate 40 except that concave portions 72 are formed on one side thereof, and a plurality of mounting portions 74 are provided on the heat spreader 70. The concave part 72 formed as a dent may be a through hole.

The convex part 62 and the concave part 72 are formed to engage each other, and when these parts are engaged with each other, the plate 60 and the heat spreader 70 are stacked in alignment.

Since the convex part 62 and concave part 72 are provided, the heat spreader 70 can be aligned with the plate 60 easily and accurately. Further, a plurality of mounting portions 74 formed on the heat spreader 70 can be attached to a plurality of mounting portions 64 formed on the plate 60 simultaneously. Alternatively, the convex portion 62 may be provided on a jig piece that is used for alignment between the plate 60 and the heat spreader 70. In this case, the plate 60 and the heat spreader 70 do not have any convex portions. Instead, a concave portion (a hole or the like) is provided on each of the plate 60 and the heat spreader 70 at a position corresponding to the convex portion of the jig piece, so that the plate and the heat spreader can be assembled in the same manner as mentioned above.

Furthermore, the plate 70 previously formed integrally with the heat spreader 70 may be used. More particularly, this arrangement can be made by providing a plate which has been drawn to have a convex shape at a region corresponding to the device hole 42. In this case, the height (depth) of drawing is up to a position corresponding to the heat spreader in the structure mentioned above. Thus, the part count can be decreased to reduce the manufacturing cost.

Further, the present invention is applicable to a front-TAB type semiconductor device in which the semiconductor chip 16 is mounted on the same side on which the bumps 14 are formed as well as a back-TAB type semiconductor device in which the semiconductor chip 16 is mounted on the side opposite to the side on which the bumps 14 are formed as shown in FIG. 8. Furthermore, a B-TAB type of insulating film having integrally formed bumps on the wiring side may be used instead of the insulating film 12. Still further, single-port bonding may be carried out by using a film carrier tape having no bumps.

Figure 10:
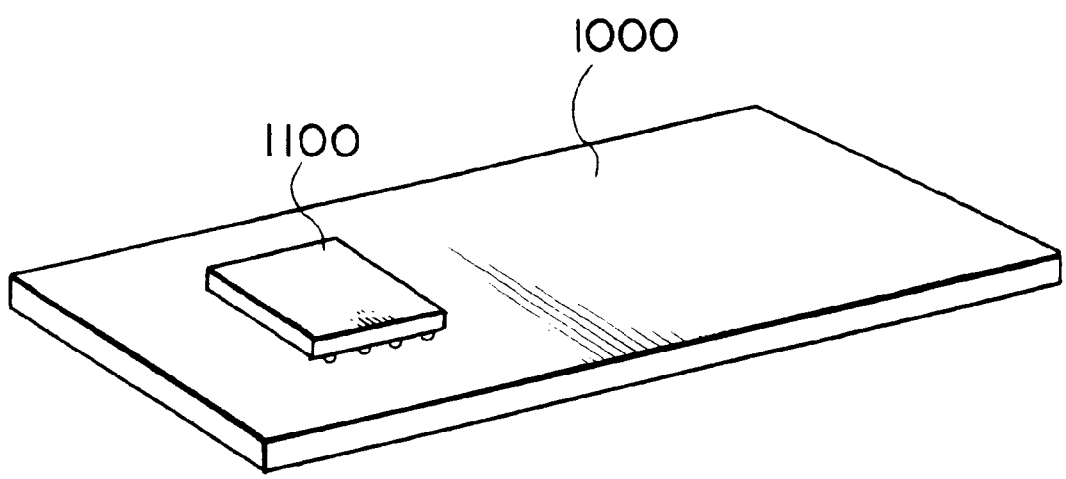
FIG. 10 is a diagram showing the embodiment of a circuit board according to the present invention.

FIG. 10 shows a circuit board 1000 on which a semiconductor device 1100 fabricated according to the present invention is mounted. It is common practice to use a circuit board made of organic resin material such as glass epoxy resin, for example. On the circuit board, wiring patterns made of copper or the like are formed to have desired circuits, and the bumps of the semiconductor device are physically connected with these wiring patterns to provide electrical conductivity.

Figure 11:
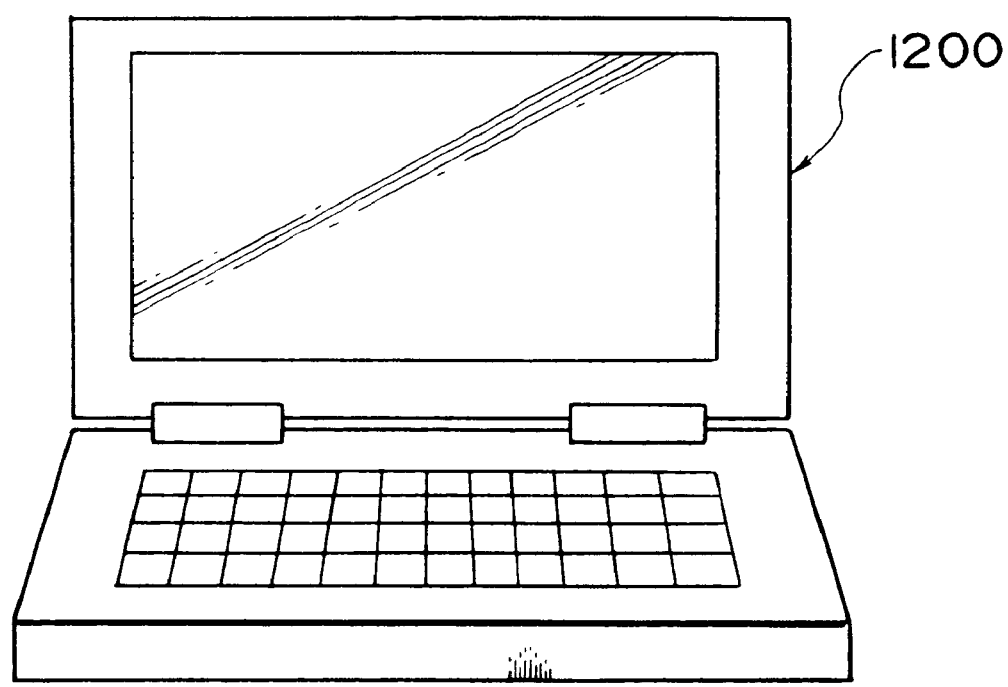
FIG. 11 is a diagram showing an electronic apparatus containing the circuit board on which is mounted the semiconductor device fabricated according to the method of the present invention.

FIG. 11 shows a notebook-type personal computer 1200 as an example of the electronic apparatus equipped with the circuit board 1000.

In addition, by applying the present invention described above, it is also possible to fabricate surface-mounting-type electronic components (either active or passive parts) having a plurality of bumps as in semiconductor microcircuit devices, for example, such electronic components as resistors, capacitors, coils, oscillators, filters, temperature sensors, thermistors, varistors, variable resistors, and fuses.

What is claimed is:

1. A method of making semiconductor devices, comprising the steps of:

preparing non-defective individual film packages having good quality, wherein each of said non-defective individual film packages has a flexible substrate having a front surface on which a wiring pattern in formed and a back surface opposite thereof, and a semiconductor chip having electrodes that are connected to said wiring pattern, said flexible substrate being larger than said semiconductor chip;

attaching the back surface of each of said non-defective individual film packages to each of mounting regions of a reinforcing member, said reinforcing member maintaining a planar configuration for said flexible substrate and circumventing said semiconductor chip; and cutting said reinforcing member into separate pieces, each of said separated pieces corresponding to each of said mounting regions on which each of said non-defective individual film packages is mounted.

2. The method of making semiconductor devices as defined in claim 1, further comprising, before said non-defective individual film packages are prepared, the steps of:

mounting said semiconductor chip on each of predetermined areas in a film carrier tape having said wiring pattern formed on each of said predetermined areas, punching out said film carrier tape into individual film packages, and selecting said non-defective individual film packages having good quality from said individual film packages through inspection.

3. The method of making semiconductor devices a defined in claim 1, wherein, after each of said non-defective individual film packages is attached to each of said mounting regions of said reinforcing member, the subsequent steps are carried out on a production line for P-BGA type packages.

4. The method of making semiconductor devices as defined in claim 2, wherein, after each of said non-defective individual film packages is attached to each of said mounting regions of said reinforcing member, the subsequent steps are carried out on a production line for P-BGA type packages.

5. The method of making semiconductor devices as defined in claim 1, after the step of attaching each of said non-defective individual film packages to each of said mounting regions of said reinforcing member, and before the step of cutting said reinforcing member, further comprising the step of forming external electrodes on said wiring pattern.

6. The method of making semiconductor devices as defined in claim 2,
after the step of attaching each of said non-defective individual film packages to each of said mounting regions of said reinforcing member, and before the step of cutting said reinforcing member, further comprising the step of forming external electrodes on said wiring pattern.

7. The method of making semiconductor devices a defined in claim 3,
after the step of attaching each of said non-defective individual film packages to each of said mounting regions of said reinforcing member, and before the step of cutting said reinforcing member, further comprising the step of forming external electrodes on said wiring pattern.

8. The method of making semiconductor devices as defined in claim 1,
wherein a slot is formed along a cutting line for said reinforcing member so as to enclose each of said mounting regions that is supported only by at least one supporting portion; and
wherein the step of cutting said reinforcing member is carried out by cutting said supporting portion.

9. The method of making semiconductor devices as defined in claim 2,
wherein a slot is formed along a cutting line for said reinforcing member so as to enclose each of said mounting regions that is supported only by at least one supporting portion; and
wherein the step of cutting said reinforcing member is carried out by cutting said supporting portion.

10. The method of making semiconductor devices as defined in claim 3,
wherein a slot is formed along a cutting line for said reinforcing member so as to enclose each of said mounting regions that is supported only by at least one supporting portion; and
wherein the step of cutting said reinforcing member is carried out by cutting said supporting portion.

11. The method of making semiconductor devices as defined in claim 4,
wherein a slot is formed along a cutting line for said reinforcing member so as to enclose each of said mounting regions that is supported only by at least one supporting portion; and
wherein the step of cutting said reinforcing member is carried out by cutting said supporting portion.

12. The method of making semiconductor devices as defined in claim 1,
after the step of attaching each of said non-defective individual film packages to each of said mounting regions of said reinforcing member, and before the step of cutting said reinforcing member, further comprising the step of attaching a heat spreading member to a region including said semiconductor chip.

13. The method of making semiconductor devices as defined in claim 2,
after the step of attaching each of said non-defective individual film packages to each of said mounting regions of said reinforcing member, and before the step of cutting said reinforcing member, further comprising the step of attaching a heat spreading member to a region including said semiconductor chip.

14. The method of making semiconductor devices as defined in claim 3,
after the step of attaching each of said non-defective individual film packages to each of said mounting regions of said reinforcing member, and before the step of cutting said reinforcing member, further comprising the step of attaching a heat spreading member to a region including said semiconductor chip.

15. The method of making semiconductor devices as defined in claim 4,
after the step of attaching each of said non-defective individual film packages to each of said mounting regions of said reinforcing member, and before the step of cutting said reinforcing member, further comprsing the step of attaching a heat spreading member to a region including said semiconductor chip.

16. The method of making semiconductor devices as defined in claim 8,
after the step of attaching each of said non-defective individual film packages to each of said mounting regions of said reinforcing member, and before the step of cutting said reinforcing member, further comprising the step of attaching a heat spreading member to a region including said semiconductor chip.

17. The method of making semiconductor devices as defined in claim 9,
after the step of attaching said of said non-defective individual film packages to each of said mounting regions of said reinforcing member, and before the step of cutting said reinforcing member, further comprising the step of attaching a heat spreading member to a region including said semiconductor chip.

18. The method of making semiconductor devices as defined in claim 10,
after the step of attaching each of said non-defective individual film packages to each of said mounting regions of said reinforcing member, and before the step of cutting said reinforcing member, further comprising the step of attaching a heat spreading member to a region including said semiconductor chip.

19. The method of making semiconductor devices as defined in claim 11,
after the step of attaching each of said non-defective individual film packages to each of said mounting regions of said reinforcing member, and before the step of cutting said reinforcing member, further comprising the step of attaching a heat spreading member to a region including said semiconductor chip.

20. The method of making semiconductor devices as defined in claim 12,
wherein an edge portion of said heat spreading member is disposed inside said cutting line for said reinforcing member; and
wherein in the step of cutting said reinforcing member, both sides of said reinforcing member are clamped by a pair of holding members at the position that is outside said heat spreading member and inside said cutting line for said reinforcing member, enabling the shear force to be applied to said reinforcing member to be cut at the position that is outside said holding members.

21. The method of making semiconductor devices as defined in claim 13, wherein an edge portion of said heat spreading member is disposed inside said cutting line for said reinforcing member; and wherein in the step of cutting said reinforcing member, both sides of said reinforcing member are clamped by a pair of holding members at the position that is outside said heat spreading member and inside said cutting line for said reinforcing member, enabling the shear force to be applied to said reinforcing member to be cut at the position that is outside said holding members.

22. The method of making semiconductor devices as defined in claim 14, wherein an edge portion of said heat spreading member is disposed inside said cutting line for said reinforcing member; and wherein in the step of cutting said reinforcing member, both sides of said reinforcing member are clamped by a pair of holding members at the position that is outside said heat spreading member and inside said cutting line for said reinforcing member, enabling the shear force to be applied to said reinforcing member to be cut at the position that is outside said holding members.

23. The method of making semiconductor devices as defined in claim 15, wherein an edge portion of said heat spreading member is disposed inside said cutting line for said reinforcing member; and wherein in the step of cutting said reinforcing member, both sides of said reinforcing member are clamped by a pair of holding members at the position that is outside said heat spreading member and inside said cutting line for said reinforcing member, enabling the shear force to be applied to said reinforcing member to be cut at the position that is outside said holding members.

24. The method of making semiconductor devices as defined in claim 16, wherein an edge portion of said heat spreading member is disposed inside said cutting line for said reinforcing member; and wherein in the step of cutting said reinforcing member, both sides of said reinforcing member are clamped by a pair of holding members at the position that is outside said heat spreading member and inside said cutting line for said reinforcing member, enabling the shear force to be applied to said reinforcing member to be cut at the position that is outside said holding members.

25. The method of making semiconductor devices as defined in claim 17, wherein an edge portion of said heat spreading member is disposed inside said cutting line for said reinforcing member; and wherein in the step of cutting said reinforcing member, both sides of said reinforcing member are clamped by a pair of holding members at the position that is outside said heat spreading member and inside said cutting line for said reinforcing member, enabling the shear force to be applied to said reinforcing member to be cut at the position that is outside said holding members.

26. The method of making semiconductor devices as defined in claim 16, wherein an outline of said heat spreading member is approximately aligned with an edge of said slot on the side of each of said mounting regions, said heat spreading member being disposed inside a connecting portion in each of said mounting regions connecting with said supporting portion; and wherein in the step of cutting said reinforcing member, both sides of said reinforcing member are clamped by a pair of holding members at the position that is outside said heat spreading member and inside a cutting line for said supporting portion, enabling the shear force to be applied to said supporting portion at the position that is outside said holding members.

27. The method of making semiconductor devices as defined in claim 17, wherein an outline of said heat spreading member is approximately aligned with an edge of said slot on the side of each of said mounting regions, said heat spreading member being disposed inside a connecting portion in each of said mounting regions connecting with said supporting portion; and wherein in the step of cutting said reinforcing member, both sides of said reinforcing member are clamped by a pair of holding members at the position that is outside said heat spreading member and inside a cutting line for said supporting portion, enabling the shear force to be applied to said supporting portion at the position that is outside said holding members.

28. The method of making semiconductor devices, as defined in claim 16, wherein said heat spreading member is superposed on said reinforcing member and has a planar configuration to cover said slot, each of said mounting regions, and said supporting portion of said reinforcing member; and wherein said heat spreading member is cut together with said reinforcing member.

29. The method of making semiconductor devices, as defined in claim 17, wherein said heat spreading member is superposed on said reinforcing member and has a planar configuration to cover said slot, each of said mounting regions, and said supporting portion of said reinforcing member; and wherein said heat spreading member is cut together with said reinforcing member.

30. The method of making semiconductor devices as defined in claim 28, wherein said heat spreading member and said reinforcing member are provided with convex and concave portions to be engaged mutually.

31. The method of making semiconductor devices as defined in claim 29, wherein said heat spreading member and said reinforcing member are provided with convex and concave portions to be engaged mutually.

32. A semiconductor device fabricated by using the method as defined in claim 1.

33. A semiconductor device fabricated by using the method as defined in claim 2.

34. A semiconductor device fabricated by using the method as defined in claim 3.

35. A semiconductor device fabricated by using the method as defined in claim 4.

36. A circuit board on which is mounted the semiconductor device as defined in claim 32.

37. A circuit board on which is mounted the semiconductor device as defined in claim 33.

38. A circuit board on which is mounted the semiconductor device as defined in claim 34.

39. A circuit board on which is mounted the semiconductor device as defined in claim 35.

40. An electronic apparatus including the circuit board as defined in claim 36.

41. An electronic apparatus including the circuit board as defined in claim 37.

42. An electronic apparatus including the circuit board as defined in claim 38.

43. An electronic apparatus including the circuit board as defined in claim 39.

\* \* \* \* \*